(12) United States Patent
Cheng

(10) Patent No.: US 12,532,578 B2
(45) Date of Patent: Jan. 20, 2026

(54) LED STRUCTURES AND METHODS OF MANUFACTURING LED STRUCTURE

(71) Applicant: ENKRIS SEMICONDUCTOR, INC., Jiangsu (CN)

(72) Inventor: Kai Cheng, Jiangsu (CN)

(73) Assignee: ENKRIS SEMICONDUCTOR, INC., Suzhou (CN)

( * ) Notice: Subject to any disclaimer, the term of this patent is extended or adjusted under 35 U.S.C. 154(b) by 417 days.

(21) Appl. No.: 18/123,138

(22) Filed: Mar. 17, 2023

(65) Prior Publication Data

US 2023/0299231 A1    Sep. 21, 2023

(30) Foreign Application Priority Data

Mar. 21, 2022  (CN) .......................... 202210281749.2

(51) Int. Cl.
*H10H 20/815* (2025.01)
*H10H 20/01* (2025.01)
*H10H 20/825* (2025.01)
*H10H 20/831* (2025.01)
*H10H 20/857* (2025.01)

(52) U.S. Cl.
CPC ...... *H10H 20/815* (2025.01); *H10H 20/0137* (2025.01); *H10H 20/825* (2025.01); *H10H 20/8312* (2025.01); *H10H 20/857* (2025.01)

(58) Field of Classification Search
CPC ............ H10H 20/815; H10H 20/0137; H10H 20/825; H10H 20/01335; H10H 20/8312; H10H 20/034; H10H 20/0362; H10H 20/854; H10H 20/857; H10H 20/84; H10H 20/01
See application file for complete search history.

(56) References Cited

U.S. PATENT DOCUMENTS

| | | | |
|---|---|---|---|
| 2010/0001257 A1* | 1/2010 | Yu | H10H 20/84 257/E33.014 |
| 2019/0355878 A1 | 11/2019 | Ahmed | |
| 2022/0231081 A1* | 7/2022 | Kim | H10H 29/142 |
| 2022/0231192 A1* | 7/2022 | Hurni | H10H 20/821 |

FOREIGN PATENT DOCUMENTS

| | | | |
|---|---|---|---|
| CN | 104409591 A | 3/2015 | |
| KR | 20190054461 A * | 5/2019 | ............ H01L 33/62 |
| WO | 2015121665 A1 | 8/2015 | |

OTHER PUBLICATIONS

English translation (Year: 2019).*

* cited by examiner

*Primary Examiner* — Latanya N Crawford Eason
(74) *Attorney, Agent, or Firm* — BSJ & SUN LLC

(57) ABSTRACT

LED structures and methods of manufacturing LED structure are provided. The LED structure includes: an LED light-emitting cell, including a first semiconductor layer, a light-emitting layer on the first semiconductor layer, and a second semiconductor layer on the light-emitting layer; a stress adjusting structure surrounding the LED light-emitting cell and applying stress to a sidewall of the LED light-emitting cell, where a lattice constant of a material of the stress adjusting structure is greater than lattice constants of materials in the LED light-emitting cell.

13 Claims, 5 Drawing Sheets

LED STRUCTURES AND METHODS OF MANUFACTURING LED STRUCTURE

CROSS REFERENCE TO RELATED APPLICATIONS

This application claims a priority of the Chinese Patent Application No. 202210281749.2, filed on Mar. 21, 2022, the entire content of which is incorporated herein by reference.

TECHNICAL FIELD

The present disclosure relates to the field of LED technology, and in particular, to LED structures and methods of manufacturing an LED structure.

BACKGROUND

In recent years, Light Emitting Diode (LED), as a new generation of green light source, is widely used in lighting, display and other fields. The light emitting diode includes an N-type semiconductor layer, a light-emitting layer, and a P-type semiconductor layer that are stacked in layers. Group III nitride represented by gallium nitride is a direct-gap wide-bandgap semiconductor material, the group III nitride has excellent properties such as high electron drift saturation speed, good thermal conductivity, strong chemical bonds, high temperature resistance and corrosion resistance, and is widely used in LED. The gallium-nitride-based LED epitaxial wafer includes a sapphire substrate, and a buffer layer, an undoped GaN layer, an N-type GaN layer, a multi-quantum well layer, and a P-type GaN layer that are sequentially stacked on the sapphire substrate, where the multi-quantum well layer includes alternately stacked InGaN quantum well layers and GaN quantum barrier layers.

SUMMARY

The purpose of the present disclosure is to provide an LED structure and a method of manufacturing an LED structure. By adjusting stress applied to a sidewall of the LED structure, a light-emitting wavelength uniformity of the LED structure can be improved.

According to an aspect of the present disclosure, there is provided an LED structure, including: an LED light-emitting cell including a first semiconductor layer, a light-emitting layer on the first semiconductor layer, and a second semiconductor layer on the light-emitting layer; a stress adjusting structure surrounding the LED light-emitting cell and applying stress to a sidewall of the LED light-emitting cell, where a lattice constant of a material of the stress adjusting structure is greater than lattice constants of materials in the LED light-emitting cell.

According to an aspect of the present disclosure, there is provided a method of manufacturing an LED structure, including: forming an LED light-emitting cell on a substrate structure, where the LED light-emitting cell includes a first semiconductor layer, a light-emitting layer on the first semiconductor layer, and a second semiconductor layer on the light-emitting layer; and forming a stress adjusting structure surrounding the LED light-emitting cell, where the stress adjusting structure applies stress to a sidewall of the LED light-emitting cell, and a lattice constant of a material of the stress adjusting structure is greater than lattice constants of materials in the LED light-emitting cell.

According to an aspect of the present disclosure, there is provided a method of manufacturing an LED structure, including: forming a stress adjusting structure on a substrate structure, providing at least one opening exposing the substrate structure in the stress adjusting structure; and forming at least one LED light-emitting cell in the at least one opening, where the at least one LED light-emitting cell each includes a first semiconductor layer, a light-emitting layer on the first semiconductor layer, and a second semiconductor layer on the light-emitting layer; where the stress adjusting structure applies stress to a sidewall of the LED light-emitting cell, a lattice constant of a material of the stress adjusting structure is greater than lattice constants of materials in the LED light-emitting cell.

According to the LED structure and the method of manufacturing the LED structure of the present disclosure, the LED structure includes an LED light-emitting cell and a stress adjusting structure, where the LED light-emitting cell includes a first semiconductor layer, a light-emitting layer on the first semiconductor layer, and a second semiconductor layer on the light-emitting layer, and the stress adjusting structure surrounds the LED light-emitting cell and covers a sidewall of the LED light-emitting cell. Due to differences in thermal expansion coefficient, lattice constant and other parameters between the material of the stress adjusting structure and the material of the light-emitting cell, the stress adjusting structure applies a tensile stress parallel to a contact surface and a compressive stress perpendicular to the contact surface to sidewalls of the first semiconductor layer, the light-emitting layer and the second semiconductor layer. The magnitude of the stress applied to the LED light-emitting cell is related to the lattice constant of the stress adjusting structure. By adjusting the lattice constant of the stress adjusting structure, the stress applied to the LED light-emitting cell is controlled. The greater the stress applied to the LED light-emitting cell is, the longer the light-emitting wavelength of the LED structure is, and the light-emitting wavelength of the LED structure is adjusted by applying stress to the LED light-emitting cell, thereby improving the light-emitting wavelength uniformity of the LED structure.

On the one hand, applying stress to the sidewall of the LED light-emitting cell increases a hole concentration in the P-type semiconductor layer of the LED light-emitting cell, thereby increasing a number of holes injected into the light-emitting layer, reducing a number of electrons in the light-emitting layer which are unrecombined with holes, reducing a number of electrons overflowing from the light-emitting layer to the P-type semiconductor layer, decreasing a non-radiative recombination, and improving the light-emitting efficiency and light-emitting intensity; on the other hand, the light-emitting layer includes InGaN material, light-emitting wavelength can be adjusted through stress, and indium (In) content required when the LED light-emitting cell emits light of the same wavelength can be reduced, thereby reducing lattice mismatch between InGaN in the light-emitting layer and other materials and improving the light-emitting efficiency.

DETAILED DESCRIPTION

Figure 1:
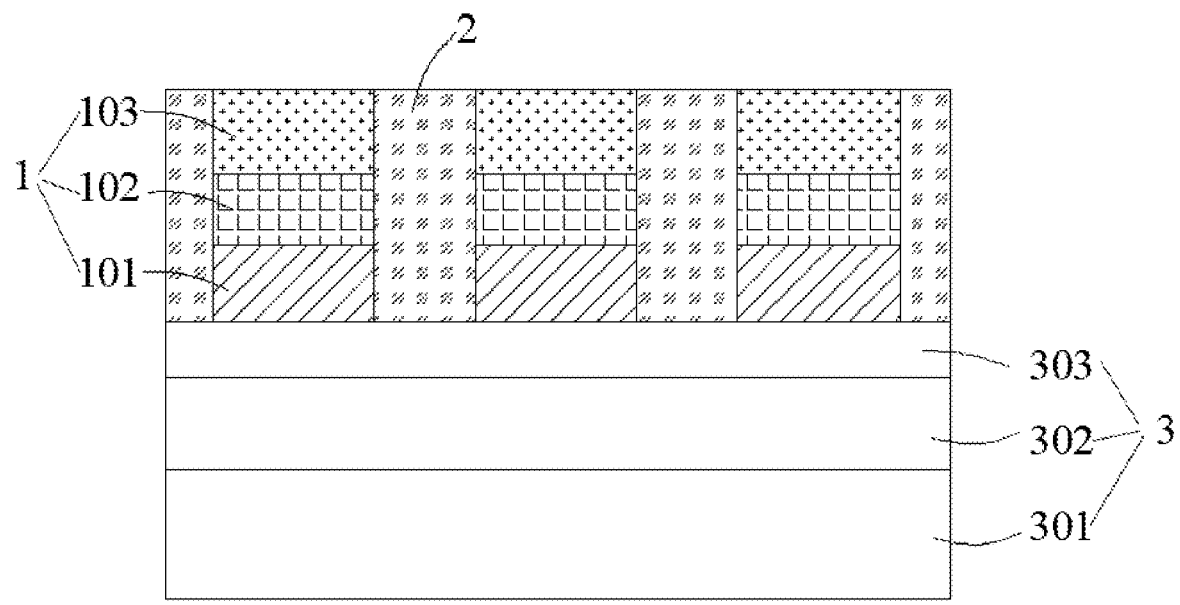
FIG. 1 is a schematic diagram of an LED structure according to a first embodiment of the present disclosure.

Various embodiments will be described in detail herein, examples of which are illustrated in the accompanying drawings. When the following descriptions involve the drawings, like numerals in different drawings represent like or similar elements unless stated otherwise. The embodiments described in the following embodiments do not represent all embodiments consistent with the present disclosure. On the contrary, they are merely examples consistent with some aspects of the present disclosure as recited in detail in the appended claims.

The terms used in the present disclosure are for the purpose of describing embodiments only, and are not intended to limit the present disclosure. Unless otherwise defined, the technical or scientific terms used in the present disclosure shall have the usual meanings understood by those with ordinary skills in the art to which the present disclosure belongs. As used in the present disclosure and in the claims, "first," "second," and similar terms do not indicate any order, quantity, or importance, but are merely used to distinguish the various components. Similar words such as "a" or "an" do not mean a quantity limit, but mean that there is at least one. "A plurality of" or "several" means two or more. Unless otherwise indicated, terms such as "front," "rear," "lower," and/or "upper" are for convenience of description and are not limited to one location or one spatial orientation. "Include" or "comprise" and other similar words mean that the elements or items listed before "include" or "comprise" include the elements or items listed after "include" or "comprise" and their equivalents, and do not exclude other elements or items. Similar words such as "connect" or "couple" are not limited to physical or mechanical connections, and can include electrical connections, whether direct or indirect. Terms like "a," "the," and "said" in their singular forms in the present disclosure and the appended claims are also intended to include plurality, unless clearly indicated otherwise in the context. It is to be understood that the term "and/or" as used herein is and includes any and all possible combinations of one or more of associated listed items.

During implementing the present disclosure, the inventor found that the related art has at least following problems: because the LED structure has undergone multiple preparation processes and is affected by preparation environment, the LED structures at different positions emit uneven wavelengths, which greatly affects a light-emitting quality of the LED structure.

In the related art, a light emitting diode includes an N-type semiconductor layer, a light-emitting layer, and a P-type semiconductor layer that are stacked in layers, that is, the light-emitting layer is located on the N-type semiconductor layer, and the P-type semiconductor layer is located on the light-emitting layer. However, an electron concentration and an electron mobility of the light emitting diode are much larger than a concentration and mobility of holes, resulting in a large number of electrons in the light-emitting layer which are unrecombined with holes. These electrons easily overflow into the P-type semiconductor layer and non-radiatively recombine with holes in the P-type semiconductor layer, thereby reducing a number of holes injected into the light-emitting layer, and reducing the light-emitting efficiency and light-emitting intensity of the light emitting diode.

A First Embodiment

The first embodiment of the present disclosure provides an LED structure and a method of manufacturing the LED structure. FIG. 1 is a schematic diagram of an LED structure according to a first embodiment of the present disclosure, the method of manufacturing the LED structure can include step S100 to step S110.

At step S100, an LED light-emitting cell 1 is formed on a substrate structure 3, and the LED light-emitting cell 1 includes a first semiconductor layer 101, a light-emitting layer 102 on the first semiconductor layer 101, and a second semiconductor layer 103 on the light-emitting layer 102.

At step S110, a stress adjusting structure 2 surrounding the LED light-emitting cell 1 is formed, the stress adjusting structure 2 applies a compressive stress perpendicular to a sidewall of the LED light-emitting cell 1 and a tensile stress parallel to the sidewall of the LED light-emitting cell 1 to the sidewall of the LED light-emitting cell 1, and a lattice constant of a material of the stress adjusting structure 2 is greater than lattice constants of materials in the LED light-emitting cell 1.

The LED structure prepared in this embodiment includes the LED light-emitting cell 1 and the stress adjusting structure 2, where one of the first semiconductor layer 101 and the second semiconductor layer 103 of the LED light-emitting cell 1 is an N-type semiconductor layer, and the other is a P-type semiconductor layer. Due to differences in such as thermal expansion coefficient, lattice constant and other parameters between the material of the stress adjustment structure 2 and the material of the LED light-emitting cell 1, the stress adjusting structure 2 applies a compressive stress perpendicular to the sidewall of the LED light-emitting cell 1 and a tensile stress parallel to the sidewall of the LED light-emitting cell 1 to a sidewall of the first semiconductor layer 101, a sidewall of the light-emitting layer 102 and a sidewall of the second semiconductor layer 103. The magnitude of the stress applied to the LED light-emitting cell 1 is related to the lattice constant of the stress adjusting structure 2. By adjusting the lattice constant of the stress adjusting structure 2, the stress applied to the LED light-emitting cell 1 is controlled. The greater the stress applied to the LED light-emitting cell 1 is, the longer the light-emitting wavelength of the LED structure is. The light-emitting wavelength of the LED structure is adjusted by applying stress to the LED light-emitting cell 1, thereby improving the light-emitting wavelength uniformity of the LED structure.

On the one hand, applying stress/pressure to the sidewall of the LED light-emitting cell 1 increases a hole concentration in the P-type semiconductor layer of the LED light-emitting cell 1, thereby increasing a number of holes injected into the light-emitting layer 102, reducing a number of electrons in the light-emitting layer 102 which are unrecombined with holes, reducing a number of electrons overflowing from the light-emitting layer 102 to the P-type semiconductor layer, decreasing a non-radiative recombination, and improving the light-emitting efficiency and light-emitting intensity; on the other hand, by adjusting the stress applied to the sidewall of the LED light-emitting cell 1, the light-emitting wavelength uniformity of the LED structure can be improved; on the other hand, the light-emitting layer 102 includes InGaN material, in this embodiment, the light-emitting wavelength can be adjusted though stress, and indium (In) content required when the LED light-emitting cell 1 emits light of the same wavelength can be reduced, thereby reducing lattice mismatch between InGaN in the light-emitting layer 102 and other materials and improving the light-emitting efficiency.

Respective steps of this embodiment are described in detail below.

At step S100, an LED light-emitting cell 1 is formed on a substrate structure 3, and the LED light-emitting cell 1 includes a first semiconductor layer 101, a light-emitting layer 102 on the first semiconductor layer 101, and a second semiconductor layer 103 on the light-emitting layer 102.

The substrate structure 3 can include a substrate 301, a nucleation layer 302 and a buffer layer 303. The substrate 301 can include a silicon substrate 301 or a silicon carbide substrate 301, but is not limited thereto, and can also include a sapphire substrate 301 and etc. The nucleation layer 302 can be disposed on one side of the substrate 301. The buffer layer 303 can cover the nucleation layer 302.

The LED light-emitting cell 1 can be formed on a side of the buffer layer 303 away from the substrate 301. In some embodiments, the first semiconductor layer 101 can be disposed on a side of the buffer layer 303 away from the substrate 301. The light-emitting layer 102 can be disposed on a side of the first semiconductor layer 101 away from the substrate 301. The light-emitting layer 102 can include at least one of a single quantum well structure, a multiple quantum well (MQW) structure, a quantum wire structure, or a quantum dot structure. The second semiconductor layer 103 can be disposed on a side of the light-emitting layer 102 away from the substrate 301. A conductivity type of the first semiconductor layer 101 is different from a conductivity type of the second semiconductor layer 103. The first semiconductor layer 101 can be a P-type semiconductor layer, and the second semiconductor layer 103 can be an N-type semiconductor layer. Alternatively, the first semiconductor layer 101 can be an N-type semiconductor layer, and the second semiconductor layer 103 can be a P-type semiconductor layer. The N-type semiconductor layer and/or the P-type semiconductor layer can include a group III nitride material. The group III nitride material can include at least one of GaN, AlGaN, InGaN, or AlInGaN. N-type ions in the N-type semiconductor layer can include at least one of silicon (Si) ions, germanium (Ge) ions, tin (Sn) ions, selenium (Se) ions, or tellurium (Te) ions. P-type doping ions in the P-type semiconductor layer can include at least one of magnesium (Mg) ions, zinc (Zn) ions, calcium (Ca) ions, strontium (Sr) ions, or barium (Ba) ions.

Figure 10:
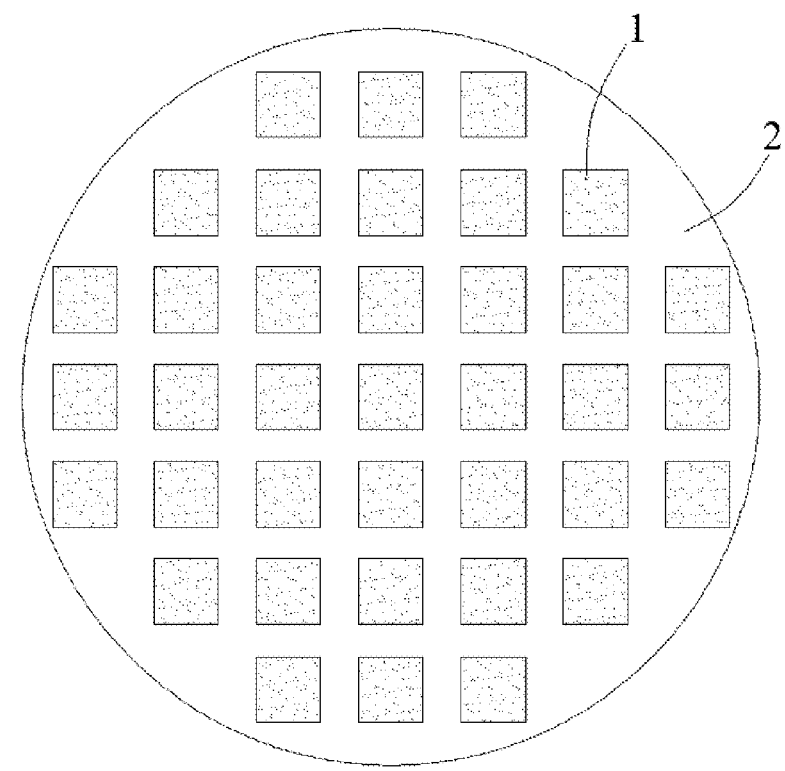
FIG. 10 is a plan view of an LED structure according to the present disclosure.

In addition, a number of LED light-emitting cells 1 formed on the substrate structure 3 can include one or more LED light-emitting cells 1. FIG. 10 is a schematic plan view of the LED structure according to the present disclosure. As shown in FIG. 10, for example, there are a plurality of LED light-emitting cells 1, the plurality of LED light-emitting cells 1 can be arranged at intervals and can be presented as an array, but the present disclosure does not limit the arrangement of the LED light-emitting cells 1. In addition, an orthographic projection of each LED light-emitting cell 1 on the substrate structure 3 can include any shape such as a square, a circle, a rectangle, or a rhombus.

For example, a formation process of the LED light-emitting cell 1 can include: forming an LED structure layer on the substrate structure 3; patterning the LED structure layer to form one or more LED light-emitting cells 1. The present disclosure can also form the LED light-emitting cells 1 by: forming a mask layer on the substrate structure 3; patterning the mask layer to form one or more through-holes on the mask layer which are exposing substrate structures 3; forming one or more LED light-emitting cells 1 in the one or more through-holes; removing the mask layer. The above-mentioned "patterning" can include steps such as etching.

At step S110, a stress adjusting structure 2 surrounding the LED light-emitting cell 1 is formed, the stress adjusting structure 2 applies a compressive stress perpendicular to the sidewall of the LED light-emitting cell 1 and a tensile stress parallel to the sidewall of the LED light-emitting cell 1 to the sidewall of the LED light-emitting cell 1, and the lattice constant of the material of the stress adjusting structure 2 is greater than lattice constants of the materials in the LED light-emitting cell 1. Lattice constant represents an attribute of a material. Different materials have different lattice constants. For semiconductor materials, taking GaN as an example, lattice constants of different GaN materials are different by controlling a content of gallium (Ga) element or a content of nitrogen (N) element. For example, taking InGaN as the material of stress adjusting structure 2, the lattice constant of stress adjusting structure 2 can be increased by increasing a content of indium (In).

The stress adjusting structure 2 can be formed in a reaction chamber, and the forming process can include: Atomic Layer Deposition (ALD), Chemical Vapor Deposition (CVD), Molecular Beam Epitaxy (MBE), Plasma Enhanced Chemical Vapor Deposition (PECVD), Low Pressure Chemical Vapor Deposition (LPCVD), or Metal Organic Chemical Vapor Deposition (MOCVD), or a combination thereof.

The stress adjusting structure 2 is insulated from the LED light-emitting cell 1. The material of the stress adjusting structure 2 is semi-insulated group III nitride, and the lattice constant of the material of the stress adjusting structure 2 is larger than the lattice constants of the materials in the LED light-emitting cell 1. For example, the lattice constant of the material of the stress adjusting structure 2 is larger than the lattice constant of the first semiconductor layer 101, the lattice constant of the light-emitting layer 102, and the lattice constant of the second semiconductor layer 103 in the LED light-emitting cell 1. With this configuration, the stress adjusting structure 2 can apply a compressive stress to the LED light-emitting cell 1 in a direction perpendicular to the sidewall of the LED light-emitting cell 1 and apply a tensile stress to the LED light-emitting cell 1 in a direction parallel to the sidewall of the LED light-emitting cell 1.

In addition, lattice constants of the stress adjusting structure 2 corresponding to different positions of the sidewall of the LED light-emitting cell 1 may be different. In some embodiments, the stress adjusting structure 2 includes a first sub-structure and a second sub-structure on the first sub-structure; the first sub-structure is located at a position corresponding to the first semiconductor layer 101 of the LED light-emitting cell 1, that is, the first sub-structure and the first semiconductor layer 101 have the same thickness in the thickness direction of the LED light-emitting cell 1; the second sub-structure is located at a position corresponding to the light-emitting layer 102 and the second semiconductor layer 103 of the LED light-emitting cell 1, that is, the second sub-structure and a combination of the light-emitting layer 102 and the second semiconductor layer 103 have the same thickness in the thickness direction of the LED light-emitting cell 1; and a lattice constant of the first sub-structure can be different from a lattice constant of the second sub-structure, the lattice constant of the first sub-structure can be greater than that of the first semiconductor layer 101, and the lattice constant of the second sub-structure can be greater than the lattice constants of the light-emitting layer 102 and the second semiconductor layer 103. For the stress adjusting structure 2, taking the material of the stress adjusting structure 2 being InGaN as an example, the stress adjusting structure 2 can be prepared by vapor deposition process. During the preparation, the content of indium (In) can be adjusted, so that the content of indium in the whole stress adjusting structure 2 is uneven, and then the lattice constants in different sub-structures of the stress adjusting structure 2 can be different.

In some embodiments of the present disclosure, the stress adjusting structure 2 on the substrate structure 3 can be formed firstly, the stress adjusting structure 2 is provided with at least one opening exposing the substrate structure 3, and then at least one LED light-emitting cell 1 is formed in the at least one opening, the at least one LED light-emitting cell 1 each includes a first semiconductor layer 101, a light-emitting layer 102 on the first semiconductor layer 101, and a second semiconductor layer 103 on the light-emitting layer 102.

The LED structure in the first embodiment of the present disclosure can be manufactured by the above-mentioned method of manufacturing the LED structure. The LED structure can include a substrate structure 3, an LED light-emitting cell 1 and a stress adjusting structure 2. The LED light-emitting cell 1 and the stress adjusting structure 2 are both disposed on the substrate structure 3. The LED light-emitting cell 1 can include a first semiconductor layer 101, a light-emitting layer 102 on the first semiconductor layer 101, and a second semiconductor layer 103 on the light-emitting layer 102. The stress adjusting structure 2 can surround the LED light-emitting cell 1, and the lattice constant of the material of the stress adjusting structure 2 is greater than the lattice constants of the materials in the LED light-emitting cell 1.

A Second Embodiment

Figure 2:
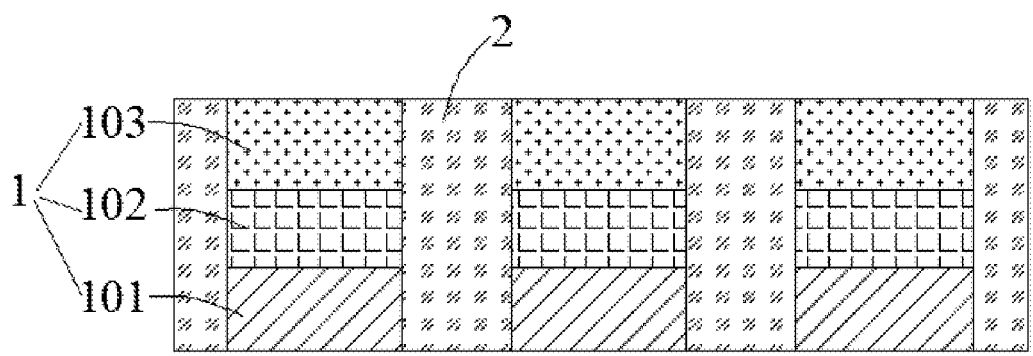
FIG. 2 is a schematic diagram of an LED structure according to a second embodiment of the present disclosure.

The LED structure and the method of manufacturing the LED structure in the second embodiment of the present disclosure are substantially the same as those in the first embodiment of the present disclosure, except that: as shown in FIG. 2, after the stress adjusting structure 2 is formed, the substrate structure 3 is removed.

A Third Embodiment

Figure 3:
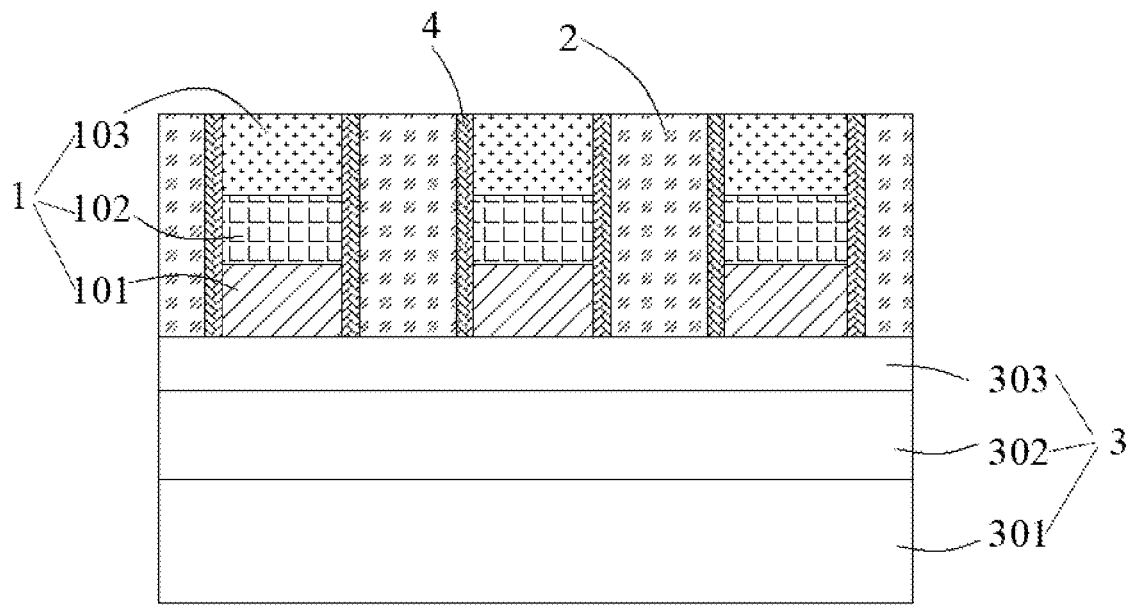
FIG. 3 and FIG. 4 are schematic diagrams of an LED structure according to a third embodiment of the present disclosure.
Figure 4:
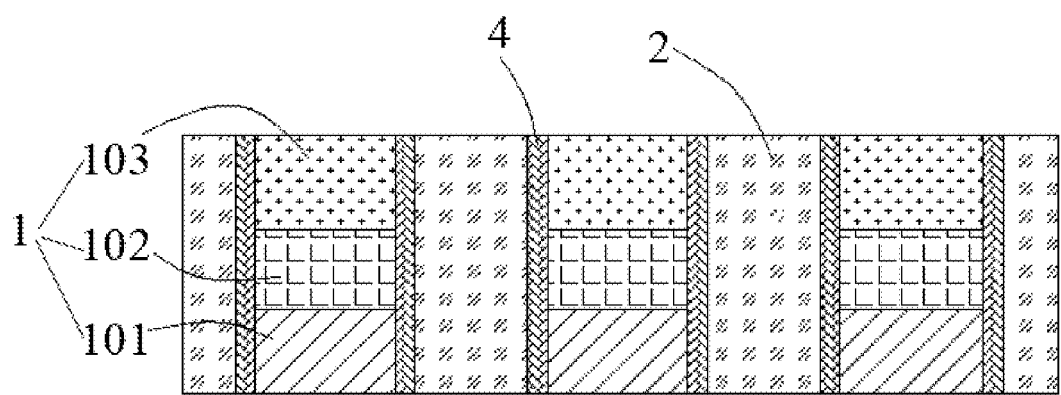

FIG. 3 and FIG. 4 are schematic diagrams of the LED structure according to the third embodiment of the present disclosure, the LED structure and the method of manufacturing the LED structure in the third embodiment of the present disclosure are substantially the same as those in the first embodiment or second embodiment of the present disclosure, except that: the method in the third embodiment further includes forming an insulating film 4 on the sidewall of the LED light-emitting cell 1, and covering the insulating film 4 by the stress adjusting structure 2. In other words, the stress adjusting structure 2 is in direct contact with the insulating film 4. The insulating film 4 can reduce non-radiative recombination. In some embodiments, the forming process of the insulating film 4 can include: passivating an edge region of the LED light-emitting cell 1 to form the insulating film 4. In some embodiments, passivation can be achieved by ions implantation. The forming process of the insulating film 4 can be performed after step S110.

The material of the stress adjusting structure 2 can include a semi-insulated group III nitride, such as InGaN, etc., whose lattice constant is greater than the lattice constants of the materials in the LED light-emitting cell 1. With this configuration, the stress adjusting structure 2 can apply a compressive stress perpendicular to the sidewall of the LED light-emitting cell 1 to the LED light-emitting cell 1, and apply a tensile stress parallel to the sidewall of the LED light-emitting cell 1 to the LED light-emitting cell 1. In this embodiment, the light-emitting layer 102 includes an InGaN material. The compressive stress causes the indium (In) content required when the LED light-emitting cell 1 emits light of the same wavelength to be reduced, thereby reducing the lattice mismatch between InGaN in the light-emitting layer 102 and other materials, and further improving the light-emitting efficiency. The above-mentioned group III nitride can also be a group III compound. In some embodiments, lattice constants of the stress adjusting structure 2 corresponding to different positions of the sidewall of the LED light-emitting cell 1 can be different by ions implantation.

In this embodiment, before step S110, a mask layer (not shown in the figures) needs to be formed on an upper surface of the LED light-emitting cell 1, and a material of the mask layer includes, for example, $SiO_2$, to avoid that, when the group III nitride material (stress adjusting structure 2) is formed at step S110, the group III nitride material, such as InGaN, covers the upper surface of the LED light-emitting cell 1, and the mask layer can be removed after step S110.

A Fourth Embodiment

Figure 6:
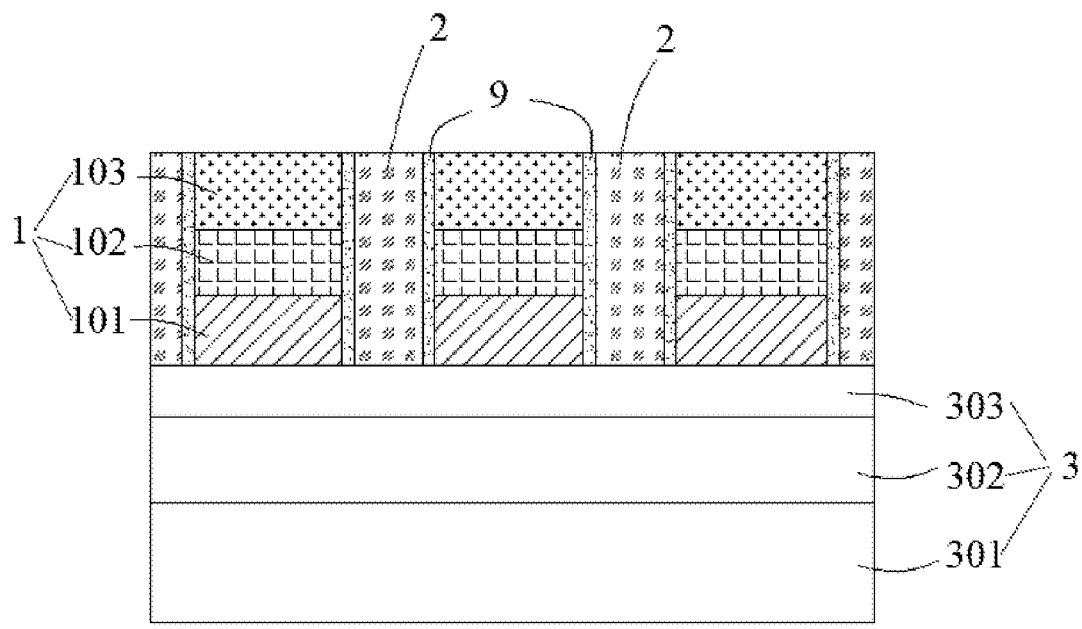
FIG. 6 and FIG. 7 are schematic diagrams of an LED structure according to a fourth embodiment of the present disclosure.
Figure 7:
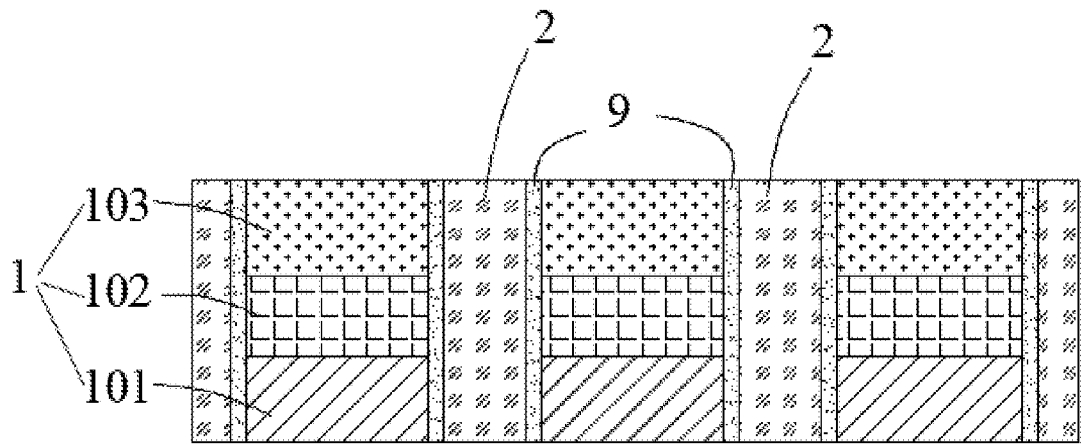

FIG. 6 and FIG. 7 are schematic diagrams of an LED structure according to a fourth embodiment of the present disclosure. The LED structure and the method of manufacturing the LED structure in the fourth embodiment of the present disclosure are substantially the same as those in the first embodiment or the second embodiment of the present disclosure, except that: in the fourth embodiment, the LED structure can further include an insulating layer 9. The insulating layer 9 can surround the LED light-emitting cell 1. The insulating layer 9 can cover the sidewall of the LED light-emitting cell 1. In some embodiments, the insulating layer 9 covers the sidewall of the first semiconductor layer 101, the sidewall of the light-emitting layer 102 and the sidewall of the second semiconductor layer 103. The stress adjusting structure 2 surrounds the insulating layer 9. A material of the insulating layer 9 can be passivated group III nitride, such as nitrogen (N) ion-doped InGaN or argon (Ar) atom-doped InGaN.

Figure 5:
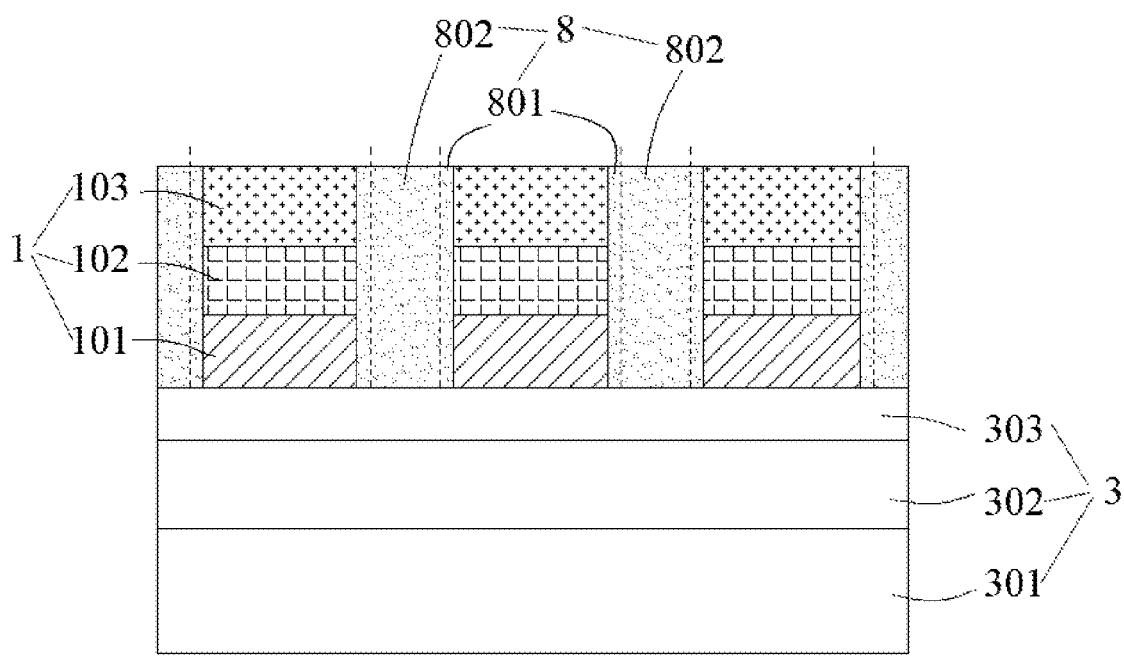
FIG. 5 is a schematic diagram of a structure obtained after forming a stress adjusting layer in a fourth embodiment of the present disclosure.

FIG. 5 is a schematic diagram of a structure obtained after forming a stress adjusting layer in the fourth embodiment of the present disclosure. The preparation process of the stress adjusting structure 2 of this embodiment can include step S1101 and step S1102.

At step S1101, after forming the LED light-emitting cell 1, a stress adjusting layer 8 surrounding the LED light-emitting cell 1 is formed by epitaxial growth, and the stress adjusting layer 8 includes a first region 801 surrounding the LED light-emitting cell 1 and a second region 802 surrounding the first region 801.

The stress adjusting layer 8 can be a group III nitride whose lattice constant is greater than the lattice constants of the materials in the LED light-emitting cell 1, and the material of the stress adjusting layer 8 can include InGaN or the like.

At step S1102, the first region 801 is passivated, the passivated first region 801 forms the insulating layer 9, and the second region 802 forms the stress adjusting structure 2.

In some embodiments, passivation can be achieved by ions implantation. Taking the material of the stress adjusting layer 8 being InGaN as an example, in the present disclosure, the passivation can be achieved by implanting destructive ions to the first region 801, so as to form the insulating layer 9 that electrically isolates the LED light-emitting cell 1. The destructive ions can include at least one of nitrogen (N), helium (He), hydrogen (H), fluorine (F), magnesium (Mg), argon (Ar), or aluminum (Al), but the disclosure is not limited thereto. Using an etching process to isolate the LED light-emitting cell 1 will cause defects on the sidewall of the LED light-emitting cell 1, and a leakage path will be generated due to the non-radiative electron-hole recombination, thereby reducing the efficiency of the LED light-emitting cell 1 and reducing the lifetime and yield of the LED structure and resulting self-heating, in the present disclosure, using ions implantation can prevent from generating leakage paths.

The above step S1102 can also include: removing the first region 801 to form a ring-shaped opening exposing the substrate structure 3; forming the insulating layer 9 filling the ring-shaped opening, and forming the stress adjusting structure 2 using the second region 802. In this embodiment, the first region 801 can be removed by an etching process, but the present disclosure does not limit this.

A Fifth Embodiment

Figure 8:
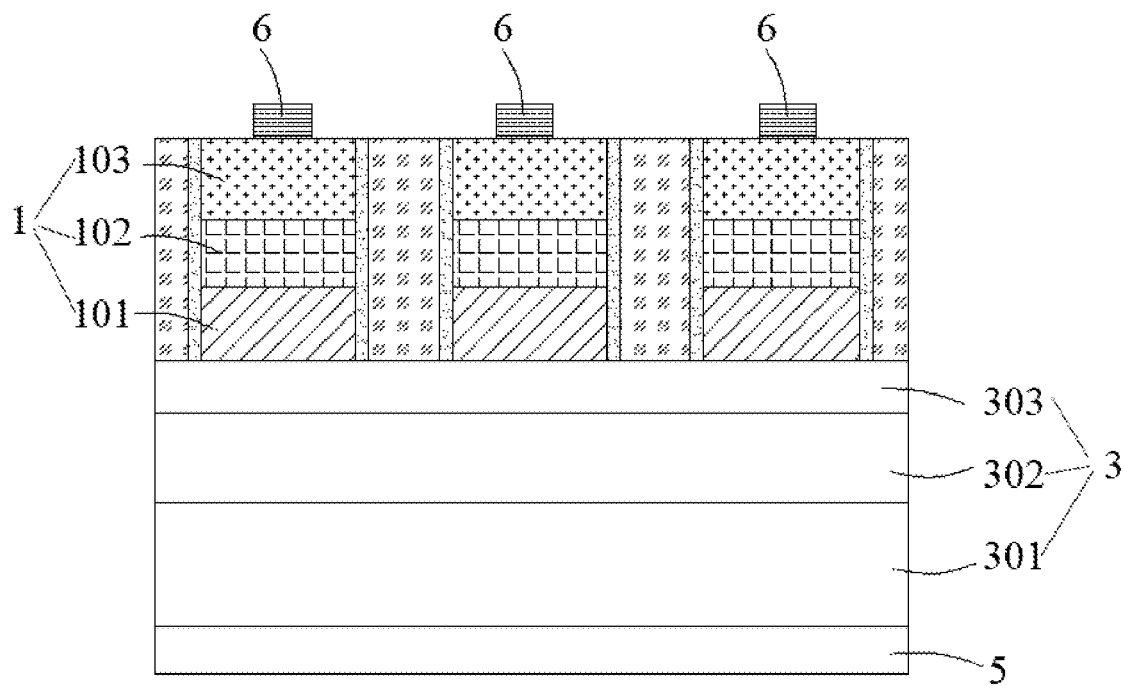
FIG. 8 is a schematic diagram of an LED structure according to a fifth embodiment of the present disclosure.

FIG. 8 is a schematic diagram of an LED structure according to a fifth embodiment of the present disclosure. The LED structure and the method of manufacturing the LED structure in the fifth embodiment of the present disclosure are substantially the same as those in any one of the first to fourth embodiments of the present disclosure, except that: a first electrode 5 electrically coupled to the first semiconductor layer 101 and a second electrode 6 electrically coupled to the second semiconductor layer 103 are formed. The first electrode 5 and the second electrode 6 can be disposed on both sides of the LED light-emitting cell 1. In some embodiments, the first electrode 5 can be disposed on a side of the substrate structure 3 away from the LED light-emitting cell 1, and the second electrode 6 can be disposed on a side of the second semiconductor layer 103 away from the light-emitting layer 102. Taking the first semiconductor layer 101 being an N-type semiconductor layer and the second semiconductor layer 103 being a P-type semiconductor layer as an example, the first electrode 5 is an N-type electrode, and the second electrode 6 is a P-type electrode. Both a material of the first electrode 5 and a material of the second electrode 6 can include at least one of gold, silver, aluminum, chromium, nickel, platinum, or titanium.

A Sixth Embodiment

Figure 9:
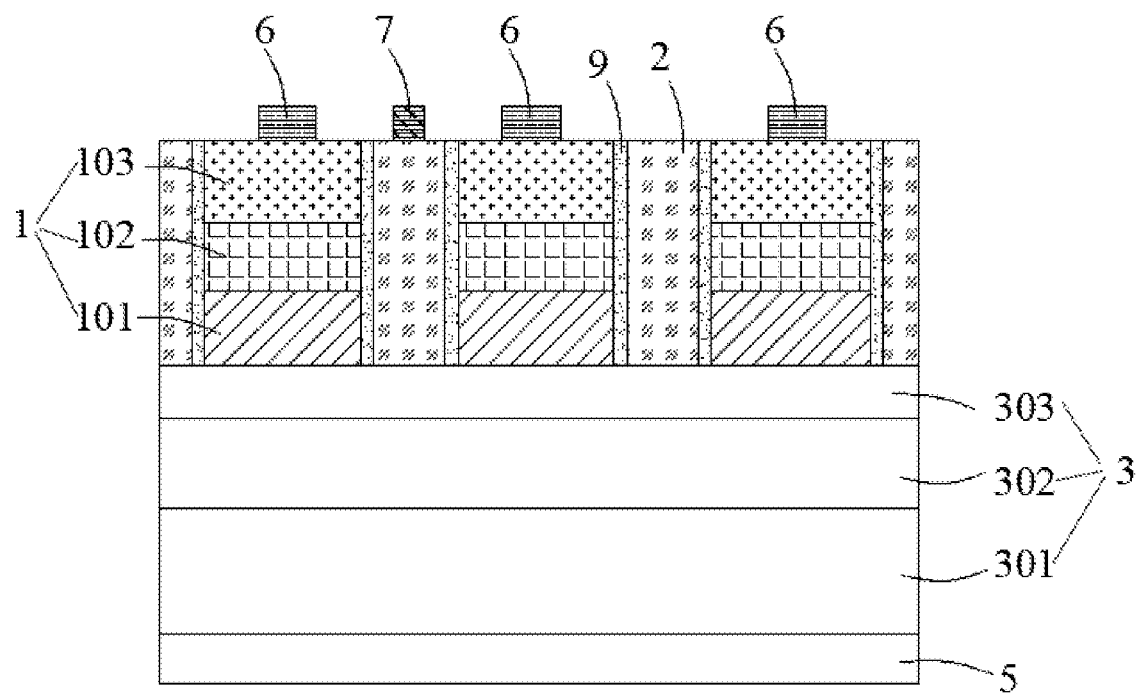
FIG. 9 is a schematic diagram of an LED structure according to a sixth embodiment of the present disclosure.

FIG. 9 is a schematic diagram of an LED structure according to a sixth embodiment of the present disclosure.

The LED structure and the method of manufacturing the LED structure in the sixth embodiment of the present disclosure are substantially the same as those in the fifth embodiment of the present disclosure, except that: the stress adjusting structure 2 is a piezoelectric material, in this embodiment, a third electrode 7 is further formed, and the third electrode 7 is electrically coupled to the stress adjusting structure 2. A material of the third electrode 7 can include at least one of gold, silver, aluminum, chromium, nickel, platinum, or titanium. Since the stress adjusting structure 2 is a piezoelectric material, a voltage can be applied to the stress adjusting structure 2 through the third electrode 7. At this time, the stress adjusting structure 2 will expand, which can further increase the stress applied by the stress adjusting structure 2 to the sidewall of the LED light-emitting cell 1.

The above descriptions are embodiments of the present disclosure, and do not limit the present disclosure in any form. Although the present disclosure has been disclosed as above in the embodiments, it is not intended to limit the present disclosure. Those skilled in the art without departing from the scope of the technical solution of the present disclosure, can make some changes or modifications by using the above disclosed technical content and these changes or modifications belong to the equivalent embodiment of the same change. Any simple modifications, equivalent changes and modifications made to the above embodiments according to the technical essence of the disclosure without departing from the technical scheme of the disclosure still fall within the scope of the technical scheme of the disclosure.

What is claimed is:

1. A light emitting diode LED structure, comprising:
   an LED light-emitting cell comprising a first semiconductor layer, a light-emitting layer on the first semiconductor layer, and a second semiconductor layer on the light-emitting layer;
   a stress adjusting structure surrounding the LED light-emitting cell and applying stress to a sidewall of the LED light-emitting cell, wherein and the stress adjusting structure comprises a piezoelectric material, and is insulated from the LED light-emitting cell, and wherein a lattice constant of a material of the stress adjusting structure is greater than lattice constants of materials in the LED light-emitting cell;
   an insulating layer surrounding the LED light-emitting cell and covering the sidewall of the LED light-emitting cell, wherein the insulating layer is surrounded by the stress adjusting structure; and
   a third electrode electrically coupled to the stress adjusting structure.

2. The LED structure according to claim 1, wherein a material of the insulating layer comprises a passivated group III nitride.

3. The LED structure according to claim 1, wherein the insulating layer is formed by implanting destructive ions into an edge region of the LED light-emitting cell.

4. The LED structure according to claim 3, wherein the destructive ions comprise at least one of nitrogen, helium, hydrogen, fluorine, magnesium, argon, or aluminium.

5. The LED structure according to claim 1, wherein the material of the stress adjusting structure comprises a semi-insulated group III nitride.

6. The LED structure according to claim 1, wherein the materials of the LED light-emitting cell and the material of the stress adjusting structure comprise group III nitrides.

7. The LED structure according to claim 1, wherein lattice constants of the stress adjusting structure corresponding to different positions of the sidewall of the LED light-emitting cell are different.

8. The LED structure according to claim 1, further comprising:
- a first electrode, electrically coupled to the first semiconductor layer; and
- a second electrode, electrically coupled to the second semiconductor layer.

9. A method of manufacturing an LED structure, comprising
- forming an LED light-emitting cell on a substrate structure, wherein the LED light-emitting cell comprises a first semiconductor layer, a light-emitting layer on the first semiconductor layer, and a second semiconductor layer on the light-emitting layer; and
- forming a stress adjusting structure surrounding the LED light-emitting cell, wherein the stress adjusting structure applies stress to a sidewall of the LED light-emitting cell, and a lattice constant of a material of the stress adjusting structure is greater than lattice constants of materials in the LED light-emitting cell; and
- forming an insulating layer, wherein the insulating layer surrounds the LED light-emitting cell and covers the sidewall of the LED light-emitting cell;
- wherein forming the insulating layer and the stress adjusting structure comprises:
  - forming the stress adjusting layer surrounding the LED light-emitting cell by epitaxial growth, wherein the stress adjusting layer comprises a first region surrounding the LED light-emitting cell and a second region surrounding the first region;
  - removing the first region to form an annular opening exposing the substrate structure; and
  - forming an insulating layer to fill the annular opening, and forming the stress adjusting structure using the second region.

10. The method of manufacturing the LED structure according to claim 9, wherein the material of the stress adjusting structure comprises a semi-insulated III group nitride.

11. The method of manufacturing the LED structure according to claim 9, wherein forming the insulating layer and the stress adjusting structure comprises:
- passivating the first region to form an insulating layer, and forming the stress adjusting structure using the second region.

12. The method of manufacturing the LED structure according to claim 9, wherein lattice constants of the stress adjusting structure corresponding to different positions of the sidewall of the LED light-emitting cell are different by ions implantation.

13. A method of manufacturing an LED structure, comprising
- forming a stress adjusting structure on a substrate structure, wherein the stress adjusting structure is provided with at least one opening exposing the substrate structure; and
- forming an LED light-emitting cell in the at least one opening, wherein the LED light-emitting cell comprises a first semiconductor layer, a light-emitting layer on the first semiconductor layer, and a second semiconductor layer on the light-emitting layer; wherein the stress adjusting structure applies stress to a sidewall of the LED light-emitting cell, and a lattice constant of a material of the stress adjusting structure is greater than lattice constants of materials in the LED light-emitting cell; and
- forming an insulating layer, wherein the insulating layer surrounds the LED light-emitting cell and covers the sidewall of the LED light-emitting cell;
- wherein forming the insulating layer and the stress adjusting structure comprises:
  - forming the stress adjusting layer surrounding the LED light-emitting cell by epitaxial growth, wherein the stress adjusting layer comprises a first region surrounding the LED light-emitting cell and a second region surrounding the first region;
  - removing the first region to form an annular opening exposing the substrate structure; and
  - forming an insulating layer to fill the annular opening, and forming the stress adjusting structure using the second region.

* * * * *